(12) United States Patent
Dishman et al.

(10) Patent No.: US 8,214,165 B2
(45) Date of Patent: Jul. 3, 2012

(54) APPARATUS, SYSTEM, AND METHOD FOR PRECISE EARLY DETECTION OF AC POWER LOSS

(75) Inventors: C. Charles Dishman, Raleigh, NC (US); Jen-Ching Lin, Apex, NC (US); Randhir S. Malik, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 545 days.

(21) Appl. No.: 12/346,307

(22) Filed: Dec. 30, 2008

(65) Prior Publication Data

US 2010/0169031 A1  Jul. 1, 2010

(51) Int. Cl.
*G01R 21/00* (2006.01)
(52) U.S. Cl. ............... 702/60; 702/61; 702/62; 702/66; 702/193
(58) Field of Classification Search .................... 702/57, 702/60, 63
See application file for complete search history.

(56) References Cited

U.S. PATENT DOCUMENTS

| | | | |
|---|---|---|---|
| 4,594,517 A | 6/1986 | Cohen et al. | |
| 4,855,722 A | 8/1989 | Mostyn et al. | |
| 5,229,651 A | 7/1993 | Baxter, Jr. et al. | |
| 5,428,769 A * | 6/1995 | Glaser et al. | 700/4 |
| 5,943,246 A | 8/1999 | Porter | |
| 6,469,883 B1 | 10/2002 | Zens | |
| 7,148,808 B1 * | 12/2006 | Pfahlert et al. | 340/636.13 |
| 2007/0159227 A1 | 7/2007 | Wittman | |

* cited by examiner

*Primary Examiner* — Drew A Dunn
*Assistant Examiner* — Mischita Henson
(74) *Attorney, Agent, or Firm* — Kunzler Needham Massey & Thorpe

(57) ABSTRACT

An apparatus, system, and method are disclosed for determining power source failure. A sampling module samples an alternating current power waveform as input to a power supply, at a sampling frequency which is a multiple of a predetermined frequency, to obtain a sampled amplitude at a known point within the predetermined period. A comparison module compares the sampled amplitude to a stored threshold amplitude to obtain a comparison result, corresponding to the known point. An accumulation module accumulates most recent comparison results. A warning module asserts an early power off warning signal if a predetermined number of the most recent comparison results each indicate that the sampled amplitude is smaller in absolute value than the stored threshold amplitude.

18 Claims, 7 Drawing Sheets

APPARATUS, SYSTEM, AND METHOD FOR PRECISE EARLY DETECTION OF AC POWER LOSS

BACKGROUND

1. Field of the Invention

This invention relates to electronic power supplies and more particularly relates to early power failure detection.

2. Description of the Related Art

With the increasing reliance on electrically powered technology, even a brief power interruption may have highly disruptive effects. This is particularly so in the case of information technology, where important data may be lost, and considerable time may be required to bring the affected systems back on line, with potentially major consequences.

High speed computer systems have the capability to do a significant amount of processing in a matter of milliseconds, enabling some mitigation of the effects of a power interruption during the relatively short period of time that it takes for a power failure to occur, if early warning is provided. It takes a small but finite amount of time, the power supply hold time, for the input power level to decline and the stored energy in the bulk capacitance of the power supply to be exhausted. The earlier the warning of an impending power failure can be provided, the more the system can accomplish by way of mitigation during those precious remaining milliseconds.

SUMMARY

From the foregoing discussion, it should be apparent that a long-felt unmet need exists for an apparatus, system, and method that detect failure of an electronic power supply as early as possible. Beneficially, such an apparatus, system, and method would detect a power loss early enough to permit a graceful shutdown if necessary and recovery if possible of an electronic device powered by the power supply.

The present invention has been developed in response to the present state of the art, and in particular, in response to the problems and needs in the art that have hitherto proven intractable under currently available early power failure detection. Accordingly, the present invention has been developed to provide an apparatus, system, and method for early power failure detection that overcome many or all of the above-discussed shortcomings in the art.

The hold time of a typical power supply, depending on the size of the boost capacitor, may be on the order of 20 milliseconds ("ms"), or about one cycle of a 60 Hertz ("Hz") alternating current ("AC") power source. One approach to detecting a power failure would to compare the voltage of the AC power source to a reference voltage with an analog comparator circuit. If the voltage falls below the reference, then an early power off warning ("EPOW") signal is generated.

Because the AC voltage is continuously varying in a sinusoidal waveform, crossing zero twice per cycle, it cannot be compared directly with the constant reference voltage. A rectifier may be used to maintain a positive voltage, which may then be fed through a capacitor having a time constant such that the voltage, while still fluctuating, remains above the reference during normal operation. However, it still takes on the order of half a cycle, or 7 to 10 ms, for the voltage to fall below the reference in the event of a power source failure, consuming much of the 20 ms hold time that otherwise might have been available for system recovery.

A more novel approach would be digitize the AC voltage and analyze it with a digital signal processing ("DSP") mechanism. The EPOW signal could then be generated much earlier, nearly doubling the time available for system recovery.

The apparatus to determine power source failure is provided with a plurality of modules configured to functionally execute the necessary steps of monitoring an AC power source by sampling it, comparing the sampled data to known good data, accumulating comparison results, and alerting the electronic device to an impending power failure based upon an accumulated pattern of results. These modules in the described embodiments include a sampling module, a comparison module, an accumulation module, and a warning module.

The apparatus, in one embodiment, is configured with the sampling module that samples an AC power waveform as input to the power supply, of a predetermined frequency and a corresponding predetermined period, at a sampling frequency which is a multiple of the predetermined frequency, to obtain a sampled amplitude at a known point within the predetermined period. The comparison module compares the sampled amplitude to a stored threshold amplitude to obtain a comparison result, corresponding to the known point within the predetermined period. The accumulation module accumulates most recent comparison results. The warning module asserts an EPOW signal if a predetermined number of the most recent comparison results each indicate that the sampled amplitude is smaller in absolute value than the stored threshold amplitude.

In an embodiment, the sampling module may include a rectifier that rectifies the power waveform such that the sampled amplitude is in absolute value. Additionally, a buffer module may buffer the sampled amplitude through a consecutive sequence of most recent sampled amplitudes for comparison with the stored threshold amplitude.

The apparatus is further configured, in one embodiment, with an initialization module that initializes the stored threshold amplitude corresponding to each known point within the predetermined period. The initialization module calibrates the stored threshold amplitude as a predetermined percentage of the sampled amplitude at the known point within the predetermined period corresponding to the stored threshold amplitude. In a further embodiment, the apparatus may include a recovery module that, in response to the EPOW signal, saves data of a computer and/or suspends operation of the computer.

A system or apparatus of the present invention is also presented to determine power source failure. The system may be embodied by a computer, a power supply, and a power failure detection apparatus, which is substantially similar to the power failure detection apparatus described above. In particular, the system, in one embodiment, includes a storage subsystem in which data of the computer is saved in response to the EPOW signal.

The system may further include a backup computer that is activated in response to the EPOW signal. In a further embodiment, where the power supply is a primary power supply, the system may include a backup power supply. The backup power supply provides power to a load powered by the primary power supply in response to the early power off warning signal.

A method of the present invention is also presented for determining power source failure. The method in the disclosed embodiments substantially includes the steps necessary to carry out the functions presented above with respect to the operation of the described apparatus and system. In one embodiment, the method includes sampling an alternating current ("AC") power waveform. The power waveform comprises an input to a power supply and a predetermined frequency and a corresponding predetermined period. The sampling is done at a frequency which is a multiple of the predetermined frequency. The sampling is to obtain a sampled amplitude at a known point within the predetermined period. The method also includes comparing the sampled amplitude to a stored threshold amplitude, which corresponds to a known point within the predetermined period. The method includes accumulating most recent comparison results and asserts an EPOW signal if a predetermined number of the most recent comparison results each indicate that the sampled amplitude is smaller in absolute value than the stored threshold amplitude.

The method includes initializing the stored threshold amplitude corresponding to each known point within the predetermined period. The method also may include calibrating the stored threshold amplitude as a predetermined percentage of the sampled amplitude at the known point within the predetermined period corresponding to the stored threshold amplitude. Calibrating the stored threshold amplitude may be performed at periodic intervals, wherein the stored threshold amplitude is stored in one of a plurality of storage areas for each successive interval, thereby allowing the existing values for the stored threshold amplitude to be obtained from one storage area while the re-calibrated values are stored in another storage area. The method may also include buffering the sampled amplitude through a consecutive sequence of most recent sampled amplitudes prior to comparing the sampled amplitude to the stored threshold amplitude.

In a further embodiment, the method may include steps to mitigate the effects of a power failure on the electronic device, such as providing power with a backup power supply. For an electronic device comprising a computer or the like, the method may also include saving data of a computer powered by a power supply that receives the power waveform in response to the EPOW signal. The method may include the suspension of the operation of the computer in response to the EPOW signal. The method may include activating a backup computer in response to the EPOW signal. The method may include providing power to a load with a backup power supply in response to the EPOW signal, the load being connected to the power supply receiving the AC power waveform.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
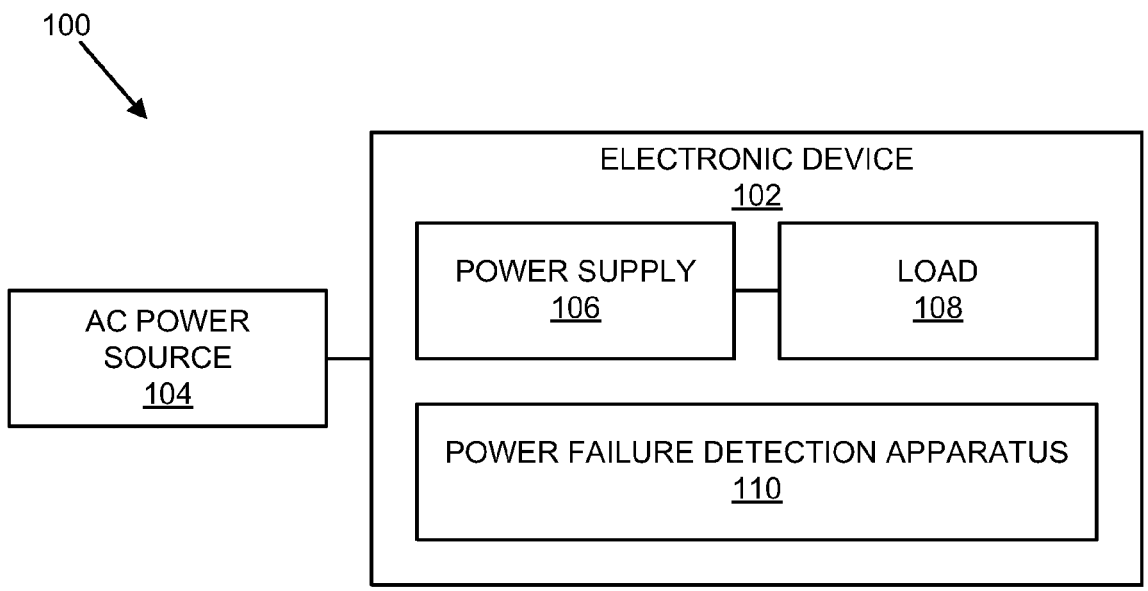
FIG. 1 is a schematic block diagram illustrating a system for power failure detection in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 is a schematic block diagram illustrating a system 100 of the present invention. The system 100 includes an alternating current ("AC") power source 104 and an electronic device 102 with a power supply 106, a load 108, and a power failure detection apparatus 110, which are described below.

The system 100 includes an electronic device 102 powered by an AC power source 104. The AC power source 104, in one embodiment, is a building power source supplied by a utility. In another embodiment, the AC power source 104 is an inverter. In one embodiment, the AC power source 104 is a single phase power source. In another embodiment, the AC power source 104 is a three-phase power source. The AC power source 104 typically provides power to the electronic device 102 in the form of a sinusoidal voltage waveform, however, harmonic content may also be present in waveform provided to the electronic load 102. The sinusoidal voltage waveform typically has a fixed fundamental frequency such as 60 hertz ("Hz") or 50 Hz. The AC power source 104 may supply 120 V, 208 V, 240 V, 480 V, or other voltage. One of skill in the art will recognize other types and characteristics of an AC power source 104.

The system 100 includes an electronic device 102 that includes at least a load 108. The electronic device 102 may be a personal computer, a server, a host, a blade in a blade center, a mainframe computer, a router, a switch, a peripheral device such as a printer, an appliance, or other device that may benefit from a power failure detection apparatus 110. The load 108 typically includes electronic components, data storage devices, processors, and the like and may include other power consuming devices, such as a motor, speakers, etc. Typically the load 108 is within the electronic device 102, but in other embodiments, at least a portion of the load 108 is located exterior to the electronic device 102. For example, one or more electronic peripheral devices may derive power from the electronic device 102, for example through a universal serial bus ("USB") connection.

In one embodiment, the system 100 includes a power supply 106 that provides power in a form suitable to the input requirements of the load 108. The form of power provided by the power supply 106 may include AC power of one or more frequencies or magnitudes, direct current ("DC") power of one or more voltage levels, and so forth. The power supply 106, in one embodiment, is included within the electronic device 102. In another embodiment, the power supply 106 is located external to the electronic device 102. For example, the power supply 102 may be part of a blade center and the electronic device 102 may be a blade server in the blade center. In one embodiment, the system 100 includes two or more power supplies 106. For example, the system 100 may require redundant power supplies 106. One of skill in the art will recognize other types and configurations of power supplies 106 in a system 100 that would benefit from a power failure detection apparatus 110.

In one embodiment, the system 100 includes two or more electronic devices 102. For example, each electronic device may be a server in a rack or a blade server in a blade center. One or more of the electronic devices 102 may include a backup computer or server. Backup computers and servers are described in more detail below. In another embodiment, the system 100 includes one or more data storage devices. For example, a blade center may include one or more disk drives, tape drives, optical drives, solid-state storage devices, and the like. Operation of a data storage device in conjunction with the power failure detection apparatus 110 is described in more detail below.

The system 100 includes a power failure detection apparatus 110 that monitors the AC power supply 104 and performs functions directed to maintaining the operational integrity of the electronic device 100 in the event of a loss or degradation of AC power. In one embodiment, the power failure detection apparatus 110 is located in the electronic device 102. In another embodiment, all or a portion of the power failure detection apparatus 110 is located exterior to the electronic device 102. For example, the system 100 may include a blade center and the power failure detection apparatus 110 may be part of a baseboard management controller ("BMC") or may be located in a power supply 106 of the blade center connected through a bus to one or more blade servers. One of skill in the art will recognize other implementations of a power failure detection apparatus 110. The function of the power failure detection apparatus 110 is described in more detail below.

Figure 2:
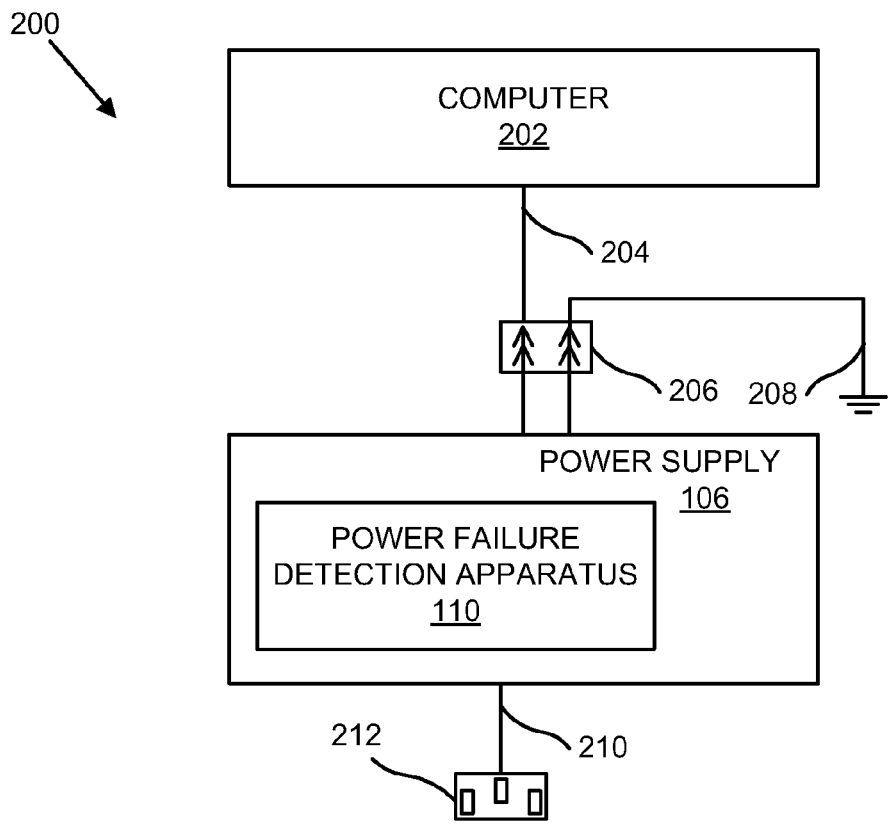
FIG. 2 is a schematic block diagram of a specific embodiment of the system for power failure detection in accordance with the present invention.

FIG. 2 is a schematic block diagram of another embodiment of the system 200 for power failure detection in accordance with the present invention. The system 200 includes a power supply 106 with a power failure detection apparatus 110, a computer 202, a direct current ("DC") voltage connection, a connector 206, a ground plane 208, an AC power connection 210, and a power plug 212, which are described below. The system 200 depicted in FIG. 2 may represent a blade center, computer rack, or other implementation where a power supply 106 is separate from a computer 202.

The system 200 includes a computer 202 that is an embodiment of the load 108. The computer 202 may receive at least one DC voltage 204 via a connector 206 from the power supply 106. The connector 206, in one embodiment, may also be grounded to a ground plane 208. Typically the computer 202 is also connected to the ground plane 208 (not shown). The ground plane 208 may be a chassis ground, an isolated ground referenced to a secondary side of the power supply 106, or other ground known to those of skill in the art.

The power supply 106 may supply one or more DC voltages 204 to the computer 202 through a direct connection, over a bus, etc. Other required DC voltages may be provided by DC-DC converters (not shown). In the embodiment shown, the power failure detection apparatus 110 is located within the power supply 106, but in other embodiments, all or a portion of the power failure detection apparatus 110 is located exterior to the power supply 106. In the embodiment, the power supply 106 receives AC power through an AC power connection 210 and a power plug 212 from an AC power source 104, such as might be sourced from an electric utility grid or other AC power source 104. The power supply 106 may include an AC adapter, an uninterruptible power supply ("UPS"), a switching power supply ("SPS"), and the like.

Figure 3:
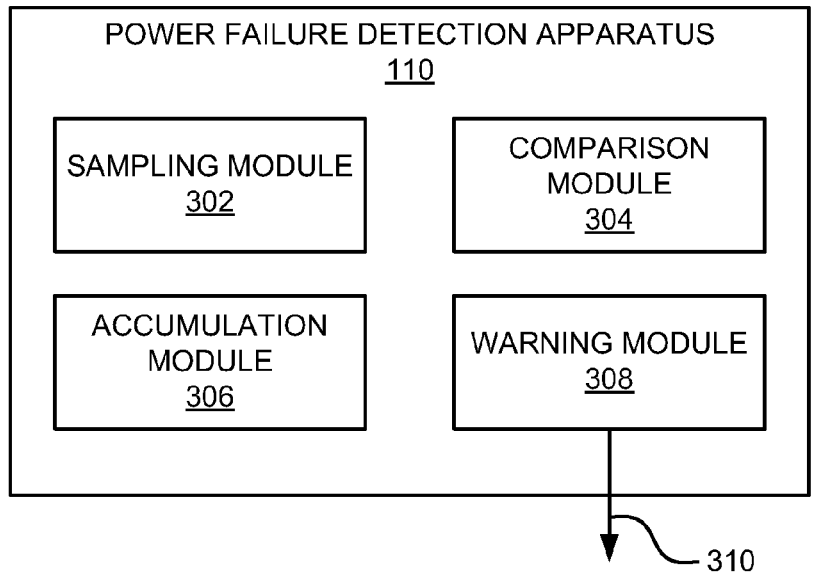
FIG. 3 is a schematic block diagram illustrating one embodiment of a power failure detection apparatus in accordance with the present invention.

FIG. 3 is a schematic block diagram of an embodiment of the power failure detection apparatus 110 in accordance with the present invention. The power failure detection apparatus 110 includes a sampling module 302, a comparison module 304, an accumulation module 306, and a warning module 308, which are described below.

The power failure detection apparatus 110 includes, in one embodiment, a sampling module 302 that samples an AC power waveform from a power source 104. The power waveform is the input power to a power supply and comprises a predetermined frequency and a corresponding predetermined period. Typically the frequency will be 60 Hz, 50 Hz, 400 Hz, or other standard frequency from a utility or other power system, but may also be another frequency. In one embodiment, the sampling module 302 samples an AC voltage waveform, but may sample a current waveform.

Typically, the AC voltage waveform has a fairly consistent amplitude that may vary over time within a prescribed range. For example, the AC voltage waveform may have a nominal root-mean-square ("RMS") value of 115 volts ("V"), but may vary over a range between 110-120 VRMS. In a three-phase system, the line-to-line AC voltage may have a range of 200-208 VRMS. Voltage fluctuations are anticipated due to loading conditions, distance from a power source 104, stiffness of the power source 104, etc. Transient voltage swings may also cause the AC voltage waveform to briefly go lower than an expected nominal range.

The sampling module 302 samples at a sampling frequency which is a multiple of the predetermined frequency. For example, if the predetermined frequency is 60 Hz, the sampling module 302 samples the AC power waveform at some multiple of 60 Hz. The sampling module 302 samples the AC power waveform to obtain a sampled amplitude at a known point within the predetermined period. Typically, the sampling module 302 references samples to some known point within a period of sinusoidal AC power waveform. In one embodiment, the sampling module 302 determines when the AC power waveform crosses zero amplitude. The known point is used to synchronize sampled amplitudes with stored threshold amplitudes.

In another embodiment, where the sampling module 302 samples a rectified AC power waveform, the sampling module 302 determines a minimum amplitude, which typically represents a point where the input AC power waveform crosses zero. In another embodiment, the sampling module 302 uses some other point in the sinusoidal AC power waveform, such as a peak voltage, or some prescribed time after a zero crossing. One of skill in the art will recognize other ways to determine a known point within a predetermined period of the AC power waveform.

In one embodiment, the sampling module 302 includes a rectifier that rectifies the AC power waveform. For example, if the sampling module 302 samples the AC power waveform at a node ahead of rectification of the power supply 106, the sampling module 302 may include a separate rectifier. The rectifier typically is a full bridge rectifier or similar functioning rectifier. In another embodiment, the rectifier is a half bridge rectifier. In a typical embodiment, the sampling module 302 samples the AC power waveform after rectification in the power supply 106. However, the sampling module 302 may be independent of a power supply 106 and may then include a rectifier. In other embodiments, the sampling module 302 samples an AC power waveform without rectification. In one embodiment, absolute values of sampled amplitudes are used. In other embodiments, negative voltages may be sampled and compared to stored threshold amplitudes that are negative.

The power failure detection apparatus 110, in one embodiment, includes a comparison module 304 that compares the sampled amplitude to a stored threshold amplitude to obtain a comparison result. The stored threshold amplitude corresponds to the known point within the predetermined period. For example, if the sampling module 302 uses a zero crossing as a reference, the sampling module 302 may sample the AC power waveform at 1 millisecond ("mS") after the zero crossing. The comparison module 304 may then compare an amplitude of the sample with a stored threshold amplitude that corresponds to 1 mS after the zero crossing. The sampling module 302 may then sample the AC power waveform at 2 mS after the zero crossing and the comparison module 304 may then compare the amplitude of the 2 mS sample with a stored threshold amplitude that corresponds to 2 mS.

In one embodiment, the comparison module 304 compares samples to discrete stored threshold amplitudes that may correspond to sampling times. In another embodiment, the comparison module 304 compares samples to a stored threshold amplitude that is derived from a threshold amplitude curve or from discrete points that make up a curve. For example, the stored threshold amplitude may be a set of points where a threshold amplitude curve is derived from the points using linear approximation or other more complex curve fitting. The comparison module 304 may then derive a stored threshold amplitude for a specific sampled point using interpolation or other technique known to those of skill in the art. One of skill in the art will recognize other ways that the comparison module 304 may compare a sampled amplitude to a stored threshold amplitude.

The comparison module 304 compares the sampled amplitude to a stored threshold amplitude to obtain a comparison result. The comparison result may be a binary number with one value (i.e. logic "1") indicating that the sampled amplitude is greater than or equal to the stored threshold amplitude and another value (i.e. logic "0") to represent that that the sampled amplitude is less than the stored threshold amplitude. One of skill in the art will recognize other ways that the comparison module 304 may obtain a comparison result by comparing a sampled amplitude to a stored threshold amplitude.

The power failure detection apparatus 110 includes, in one embodiment, an accumulation module 306 that accumulates the comparison result into a consecutive sequence of most recent comparison results. For example, the accumulation module 306 may include a first-in, first-out ("FIFO") buffer that stores a most recent comparison result and at the same time ejects a comparison result off of the back of the FIFO buffer such that a certain number of comparison results are always stored. In another embodiment, the accumulation module 306 includes a buffer that is cleared at a known point in the sampled AC power waveform and then stores comparison results in a consecutive sequence until the buffer is again cleared at a next zero crossing. In other embodiments, the accumulation module 306 accumulates comparison results spanning more than one zero crossing of the sampled AC power waveform.

In one embodiment, the accumulation module 306 accumulates comparison results where the comparison results are not stored in a consecutive sequence. For example, the comparison results may be stored in a buffer or memory such that the most recent comparison results are included but in no specific order or sequence. One of skill in the art will recognize other ways for the accumulation module 306 to accumulate comparison results into a consecutive sequence of most recent comparison results.

The power failure detection apparatus 110 includes a warning module 308 that asserts an early power off warning ("EPOW") signal 310 if a predetermined number of the most recent comparison results each indicate that the sampled amplitude is smaller in absolute value than the stored threshold amplitude. For example, if the accumulation module 306 accumulates 100 comparison results and one, ten, twenty or any number of the most recent stores comparison results indicate that a sampled amplitude is greater than a stored threshold amplitude, the warning module 308 does not assert the EPOW signal 310. If on the other hand, the 100 accumulated comparison results each indicate that the sampled amplitude is less than the corresponding stored threshold amplitude, the warning module 308 asserts the EPOW signal 310.

The EPOW signal 310, in various embodiments, may be an interrupt, a message, a communicated data packet, or other signal that is capable of indicating that a power failure has occurred. The EPOW signal 310 may be sent to a computer 202, electronic device 102, BMC, a display, a light-emitting diode ("LED"), etc. The warning module 308 may assert one or more EPOW signals 310 in various forms. The EPOW signal 310 may then trigger some other action, such as storing a context and associated buffers, memory contents, states, etc.

The EPOW signal 310 may trigger storing data, commands, parameters, etc. to a data storage device, and may also trigger an orderly shutdown. The EPOW signal 310 may also trigger startup of a backup computer on another power source, may trigger activation of an uninterruptable power supply, connection of an alternate power source 104, etc. One of skill in the art will recognize other actions triggered when the warning module 308 asserts an EPOW signal 310.

In the present invention, the EPOW signal 310 is asserted substantially earlier than in the prior art, thereby increasing the time available for recovery before the power supply 106 becomes completely exhausted.

Figure 4:
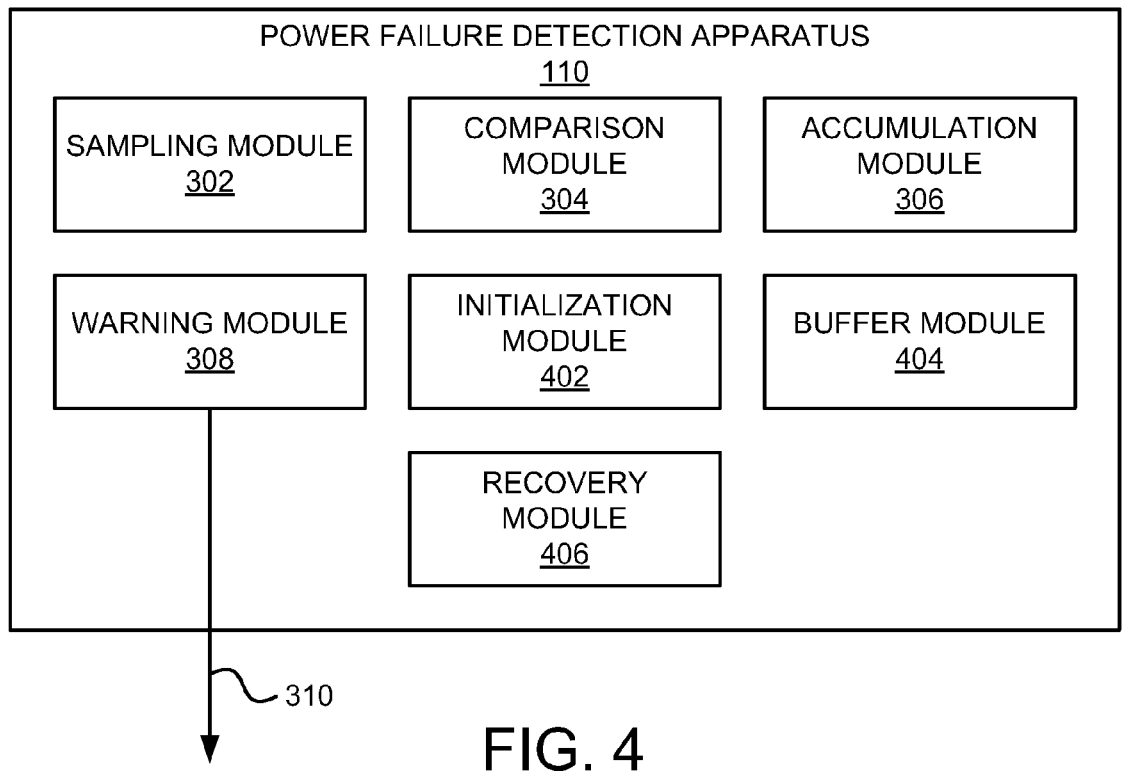
FIG. 4 is a schematic block diagram illustrating another embodiment of the power failure detection apparatus in accordance with the present invention.

FIG. 4 is a schematic block diagram illustrating another embodiment of the power failure detection apparatus 110, comprising a number of modules which may or may not all be present in various embodiments thereof. The power failure detection apparatus 110 may include a sampling module 302, a comparison module 304, an accumulation module 306, and a warning module 308, which are substantially similar to those describe above in relation to FIG. 3. The power failure detection apparatus 110 may also include an initialization module 402, a buffer module 404, and a recovery module 406, which are described below.

The power failure detection apparatus 110 includes an initialization module 402 that initializes the stored threshold amplitude corresponding to each known point within the predetermined period and calibrates the stored threshold amplitude as a predetermined percentage of the sampled amplitude at the known point within the predetermined period corresponding to the stored threshold amplitude. For example, the initialization module 402 may use sampled amplitudes received from the sampling module 302 to acquire a sampled waveform and then may scale each sample by a fixed percentage, such as 80% of the sampled amplitude to obtain stored threshold amplitudes. For example, for a half cycle, the initialization module 402 may obtain from the sampling module 302 a series of sampled amplitudes starting from a zero crossing of the sampled AC power waveform. Each sampled amplitude will typically vary in amplitude throughout the half cycle. The initialization module 402 may then multiply each sampled amplitude by 0.8 and then store the samples in sequence to create a set of stored threshold amplitudes.

In another embodiment, the initialization module 402 uses an ideal sinusoidal waveform that has an amplitude within a nominal voltage range of the sampled AC waveform and then multiplies the ideal sinusoidal waveform by a scalar constant, such as 0.5, to obtain a scaled ideal sinusoidal waveform to be used to derive stored threshold amplitudes. The initialization module 402 may then store discrete samples that correspond to anticipated sample times or may store the scaled waveform in a table or other data structure where the comparison module 304 may derive a stored threshold amplitude to be compared with a sampled amplitude corresponding to a same point in time within a sinusoidal AC power waveform. One of skill in the art will recognize other ways that the initialization module 402 can obtain a sampled or ideal waveform and then scale the waveform to facilitate deriving or retrieving stored threshold amplitudes.

The power failure detection apparatus 110, in one embodiment, includes a buffer module 404 that buffers the sampled amplitude through a consecutive sequence of most recent sampled amplitudes for comparison with the stored threshold amplitude. The buffer module 404 may include a FIFO buffer, a stack, a location in memory, or other data storage device that may be used to store sampled amplitudes in sequence.

The power failure detection apparatus 110, in one embodiment, includes a recovery module 406. The recovery module 406 performs one or more recovery steps in response to the warning module 308 asserting an EPOW signal 310. In one embodiment, the recovery module 406 saves data of a computer 202. The data may include parameters, memory contents, buffer contents, variables, ranges, states, executing commands, etc. associated with a present context of the computer 202. In another embodiment, the recovery module 406 suspends operation of the computer 202. Typically the computer 202 is powered by the power supply that receives the AC power waveform that is sampled by the sampling module 302 and is determined to be failing by the warning module 308.

Figure 5:
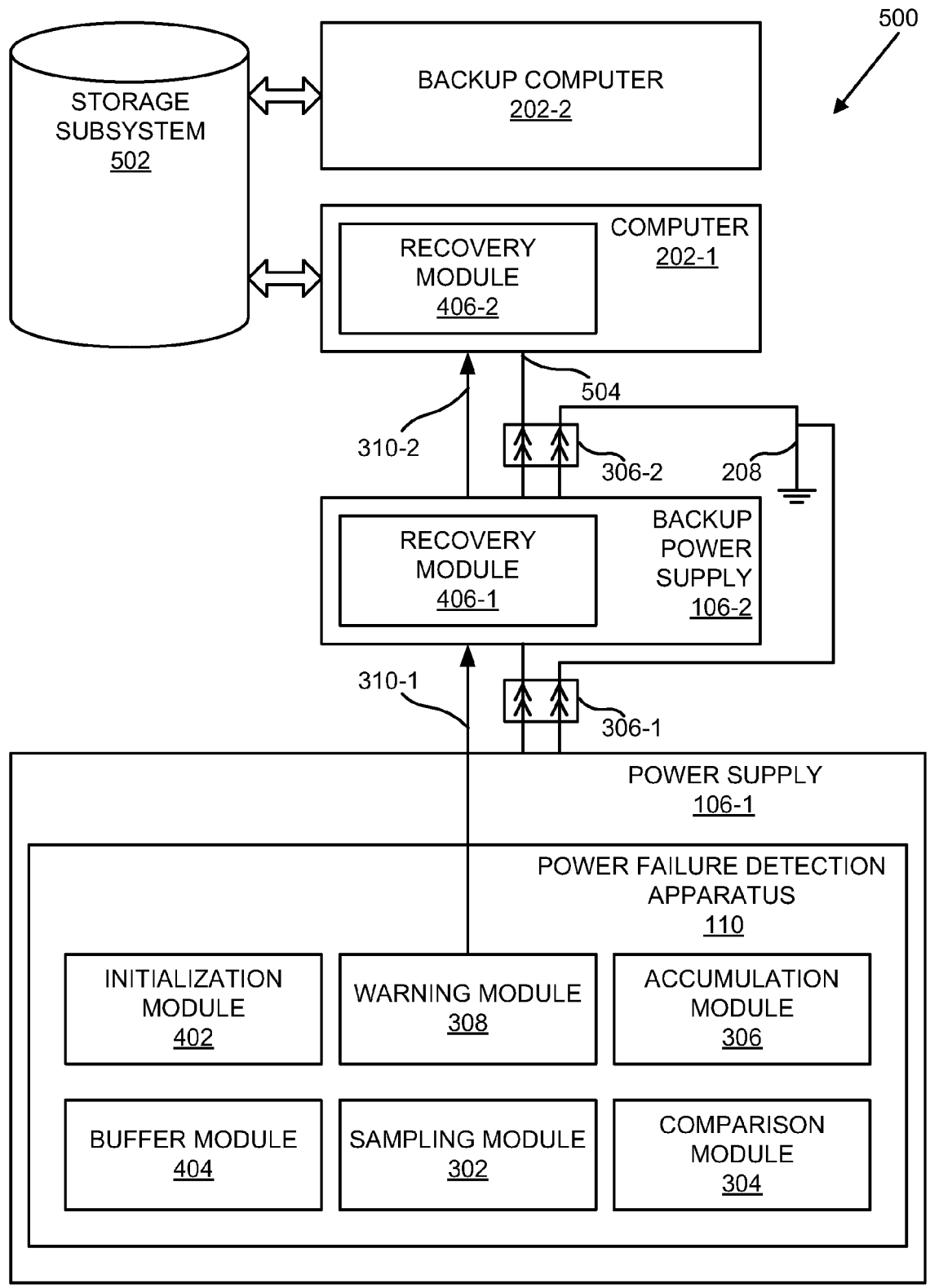
FIG. 5 is a schematic block diagram of another embodiment of a system illustrating an embodiment of a recovery module and related apparatus.

FIG. 5 is a schematic block diagram of a specific embodiment of a system 500 for early power failure detection. The system 500 illustrates an embodiment of the recovery module 406 and related apparatus responsive to the EPOW signal 310. A primary power supply 106-1 is connected by a primary connector 306-1 in series with a backup power supply 106-2 having a backup connector 306-2 to provide a DC voltage 504 to a primary computer 202-1. A backup computer 202-2 may also be provided, being powered independently from the primary computer 202-1. In another embodiment (not shown), the primary power supply 106-1 and the backup power supply 106-2 may both be connected in parallel directly to the primary computer 202-1, wherein the primary computer 202-1 may be configured to accept both the primary connector 306-1 and the backup connector 306-2.

In one scenario, an impending power failure may be detected within the primary power supply 106-1, causing a primary EPOW signal 310-1 to be asserted by the warning module 308. In response to the primary EPOW signal 310-1, a primary recovery module 406-1 may switch the backup power supply 106-2 in place of the primary power supply 106-1 to provide power to the primary computer 202-1. The backup power supply 106-2 may receive power from a battery, a generator, an AC power outlet 104 on a different circuit than the primary power supply 106-1, and so forth.

In a subsequent scenario, an impending power failure may be detected within the backup power supply 106-2, causing a backup EPOW signal 310-2 to be asserted by a backup power failure detection apparatus (not shown). In response to the backup EPOW signal 310-2, a backup recovery module 406-2 may be activated. In one embodiment, the backup recovery module 406-2 may comprise software that saves data of the primary computer 202-1 in a storage subsystem 502. In a further embodiment, data processing may be gracefully suspended on the primary computer 202-1 by the backup recovery module 406-2 and then resumed on the backup computer 202-2 in a transparent fail-over fashion. The backup computer 202-2 may access the data that was saved by the backup recovery module 406-2 in the storage subsystem 502.

Figure 6:
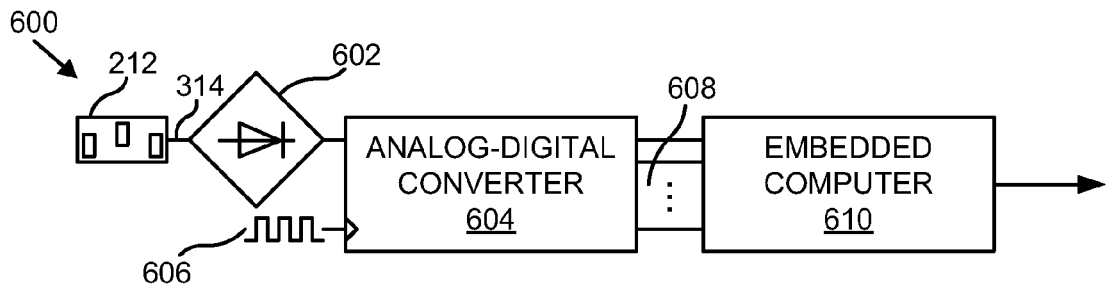
FIG. 6 is a schematic block diagram of a digital signal processing platform ("DSP") comprising an embodiment of the power failure detection apparatus.

FIG. 6 is a schematic block diagram of a digital signal processing platform ("DSP") 600 comprising one embodiment of the power failure detection apparatus 110. The power plug 212 sources the AC power source 104 to receive AC input power, having a predetermined frequency and a corresponding predetermined period. The AC input power is rectified by a rectifier 602. An analog-to-digital ("A/D") converter 604 samples the output of the rectifier 602 at a sampling frequency 606 which is a multiple of the predetermined frequency, to sample the amplitude at known points within the predetermined period. The rectifier 602 and A/D converter 604 may comprise the sampling module 302.

The A/D converter 604 provides a digitally encoded sampled amplitude 608 to an embedded computer 610. The embedded computer 610 may be comprised of a hardware platform and a software stack. The hardware platform may comprise one or more processors, a bus, a memory, an input/output interface, and a non-volatile storage. The software stack may comprise firmware, an operating system, and applications. The comparison module 304, the accumulation module 306, and the warning module 308 may comprise software running on the embedded computer 610, yielding the EPOW signal 310.

In one embodiment, the digitally encoded sampled amplitude 608 may be sourced by an output register of the A/D converter 604, accompanied by an interrupt to indicate when the register has been loaded. In response to the interrupt, the embedded computer 610 may read the digitally encoded sampled amplitude 608 into a queue in the memory of the embedded computer 610. The output register and the queue may comprise the buffer module 404.

Figure 7:
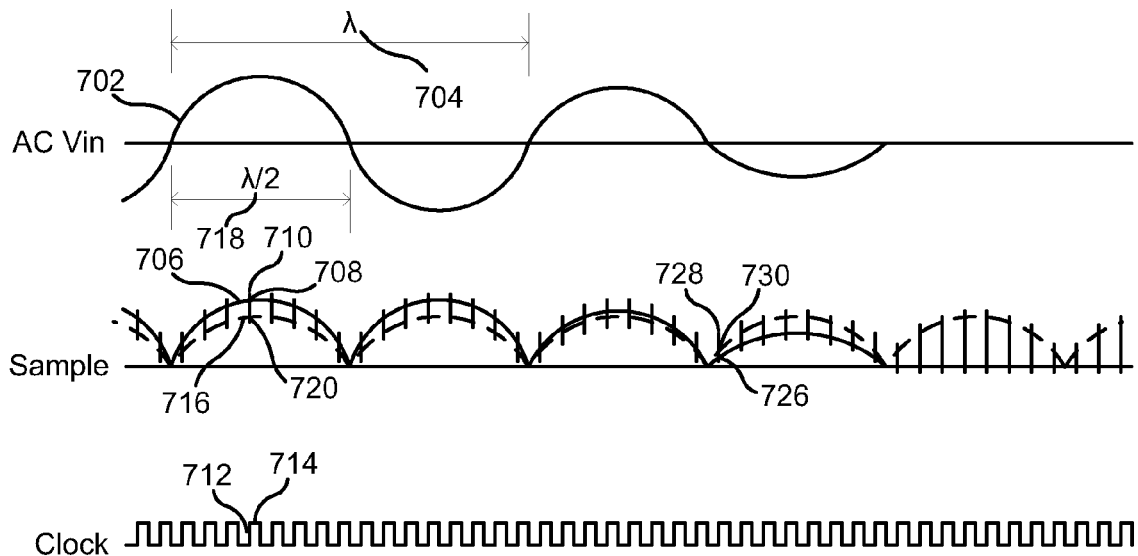
FIG. 7 is a timing diagram illustrating the relative timing of signals of the DSP to yield the EPOW signal.
Figure 7:
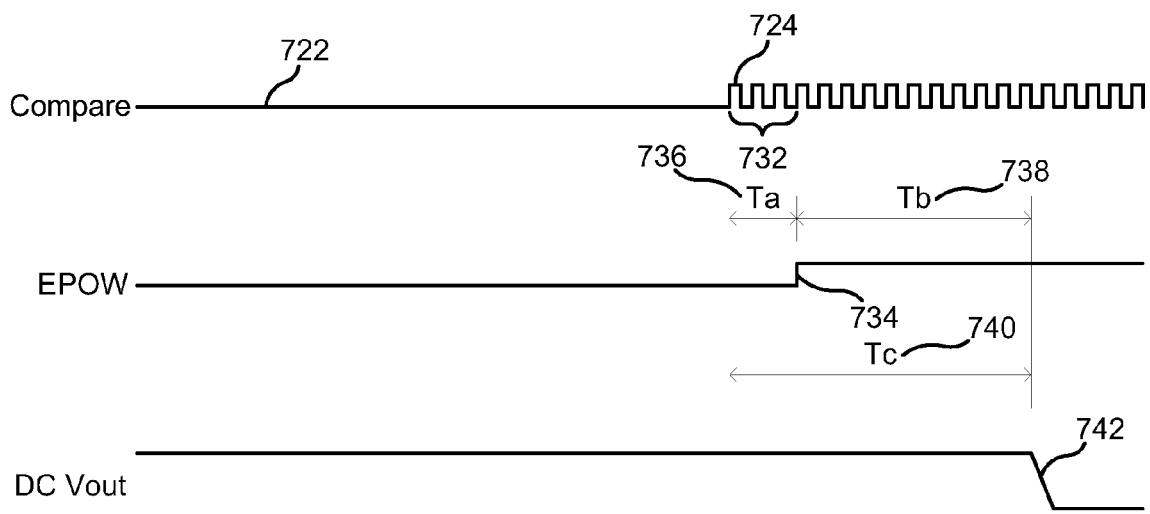

FIG. 7 is a timing diagram illustrating the relative timing of signals of one embodiment of the power failure detection apparatus 110. For example the power failure detection apparatus 110 may be implemented using the DSP 600 described in relation to FIG. 6 to yield the EPOW signal 310. An AC power waveform 702 shows the voltage over time of the AC power 314 from the power plug 212 of the AC power source 104. As can be seen, the power waveform 702 is a sinusoid of a predetermined frequency having a corresponding predetermined period 704. Note that the amplitude of the power waveform 702 begins decreasing over time during the second full period shown and then remains at zero thereafter, representing a power failure.

A rectified power waveform 706 shows the voltage over time of the output of rectifier 602. As can be seen, the rectified power waveform 706 has an amplitude which is substantially the absolute value of that of the power waveform 702. A sampled amplitude 708 may be obtained by the A/D converter 604 at a known point 710 at each rising edge 712 of a clock 714 at the sampling frequency 606 which is a multiple of the predetermined frequency having the corresponding predetermined period 704. The sampled amplitude 708 may then be buffered as a consecutive sequence of the most recent sampled amplitudes by the buffer module 404 and processed by the embedded computer 610.

Juxtaposed with the rectified power waveform 706 is a threshold amplitude 716, shown as a dashed waveform superimposed along the same timeline, representing an amplitude below which the amplitude of the rectified power waveform 706 would be indicative of a power failure. As can be seen, it repeats identically every half period 718 of the predetermined period 704. The threshold amplitude 716 at each known point 710 within the half period 718 may be stored consecutively in the non-volatile storage of the embedded computer 610 as a stored threshold amplitude 720. The same stored threshold amplitude 720 may thus be accessed from the non-volatile storage for each successive half period thereafter.

The comparison module 304 running on the embedded computer 610 may then successively compare each sampled amplitude 708 with the corresponding stored threshold amplitude 720 at the next consecutive known point 710, yielding a comparison result 722, which in this case is negative. As the rectified power waveform 706 begins decreasing over time, eventually a positive comparison result 724 is obtained when a sampled amplitude 726 obtained a known point 728 is smaller in absolute value than a corresponding saved threshold amplitude 730.

The accumulation module 306 may then accumulate a consecutive sequence of most recent comparison results 732. If a predetermined number N of the most recent comparison results 732 are all positive, then the warning module 308 may assert the EPOW signal 310. In this illustration the predetermined value of N is 3, at which point the rising edge 734 of the EPOW signal 310 occurs. In practice, N is typically large enough to avoid spurious assertion of the EPOW signal 310 on transient, harmless variations in the AC power waveform 702. Conversely, N is typically small enough to yield a suitably short detection time ("Ta") 736 so as to provide as long a recovery time ("Tb") 738 as possible within the overall hold time ("Tc") 740, prior to the falling edge 742 of the DC voltage 504. If the sampling frequency 606 were 1 MHz, and a value of 100 chosen for N, then Ta 736 would be 0.1 ms, much shorter than the 7 to 10 ms of an analog approach.

Figure 8:
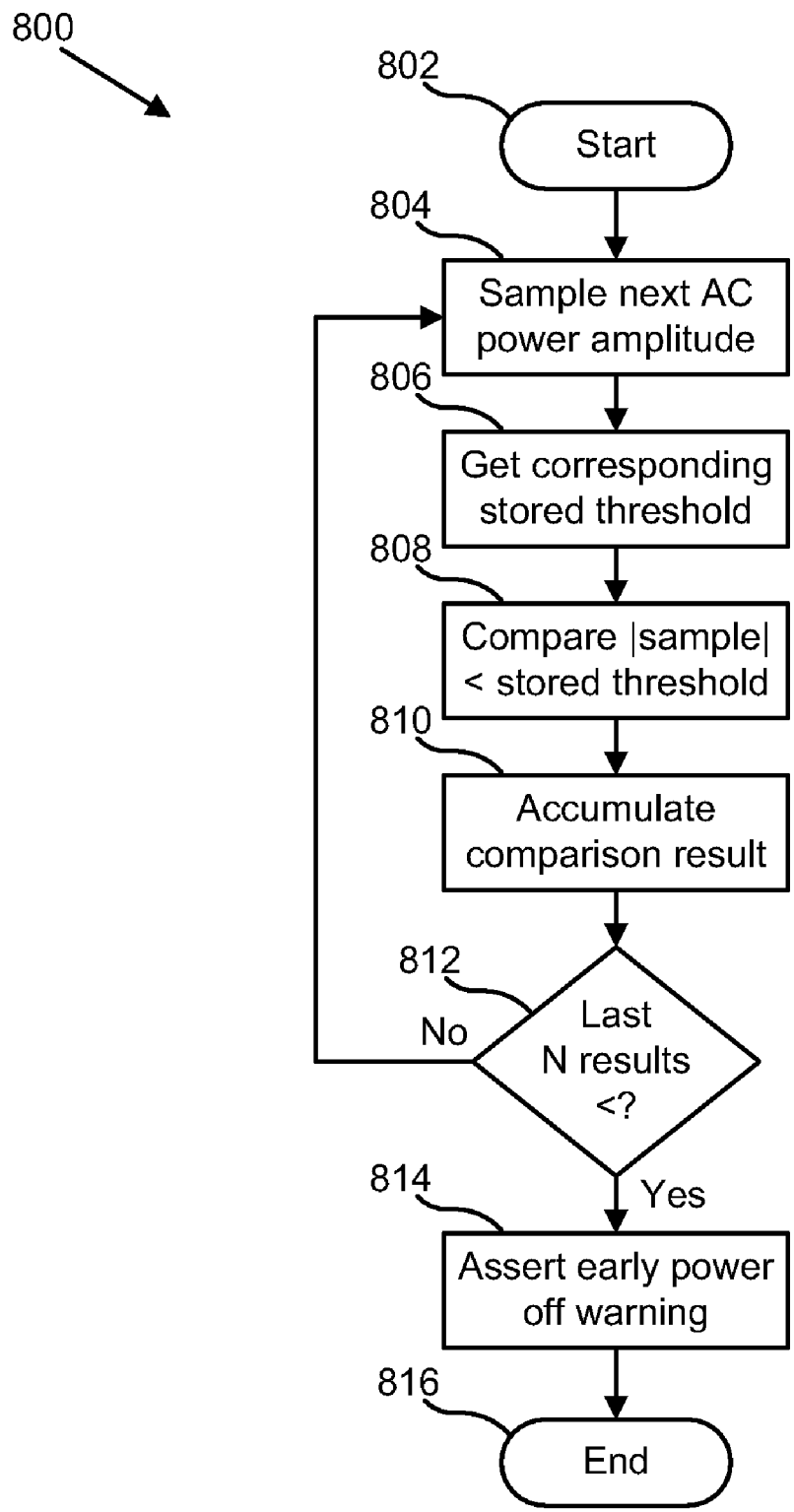
FIG. 8 is a schematic flow chart diagram illustrating one embodiment of a method for power failure detection according to the present invention.

FIG. 8 is a schematic flow chart diagram illustrating one embodiment of a method 800 for power failure detection according to the present invention. The method 800 starts 802 and the AC power waveform 702 is sampled 804 to obtain the sampled amplitude 708. The corresponding stored threshold amplitude 720 is obtained 806 and compared 808 with the sampled amplitude 708 to yield the comparison result 722, wherein a positive comparison result 724 means that the sampled amplitude 726 was smaller in absolute value than the corresponding saved threshold amplitude 730. The comparison result 722 is accumulated 810 into the consecutive sequence of most recent comparison results 732. The warning module 308 determines 812 if all of the last N results are all positive (i.e. sampling amplitude is less than the stored threshold amplitude). If the warning module 308 determines 812 that the last N comparison results were not all positive, then the method 800 continues with the step of sampling 804 at the next consecutive known point 710. If the warning module 308 determines 812 that the last N comparison results were all positive, then the EPOW signal 310 is asserted 814 and the method 800 ends 816.

Figure 9:
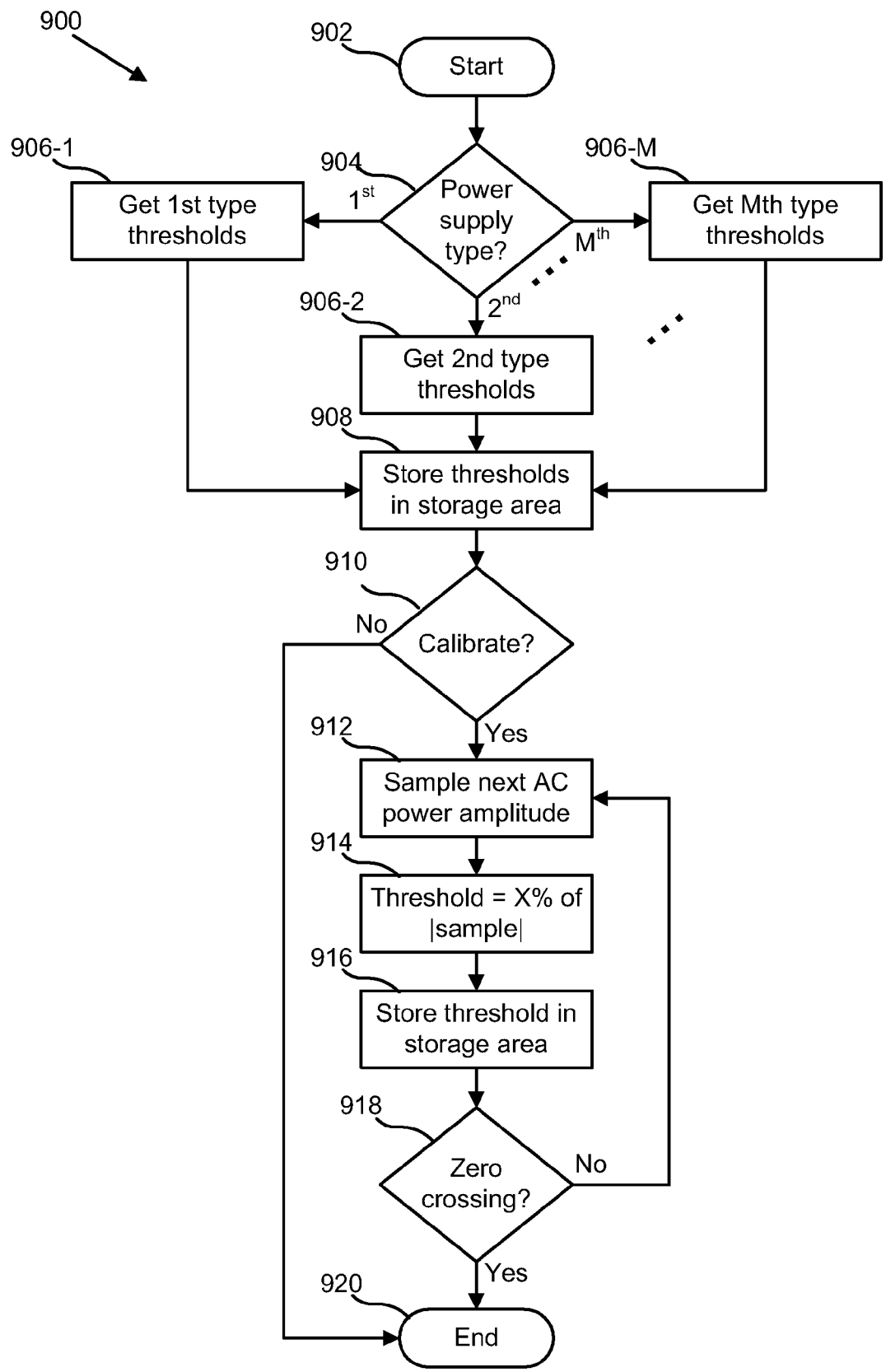
FIG. 9 is a schematic flow chart diagram illustrating one embodiment of a method for initialization of the power failure detection apparatus in accordance with the present invention.

FIG. 9 is a schematic flow chart diagram illustrating one embodiment of a method 900 for initialization of the power failure detection apparatus 110 in accordance with the present invention. The method 900 starts 902 and the type of power supply 106 is determined 904. The type may include the frequency, voltage, and so forth. The power failure detection apparatus 110 obtains 906 a consecutive sequence of stored threshold amplitudes 720 corresponding to the type of power supply 106 and stores 908 the threshold amplitudes in a storage area of the embedded computer 610, such as non-volatile storage, memory, and the like. The initialization module 402, in one embodiment, determines 910 if a calibration is required. If the initialization module 402 determines 910 that no calibration is required, then the method 900 ends 920.

If the initialization module 402 determines 910 that an initial calibration is required, the sampling module 302 starts sampling 912 the AC power waveform 702 to obtain sampled amplitudes 708, beginning at the start of a half period 718. In one embodiment, the sampling module 402 samples 912 the AC power waveform 702 multiple times for the same known point 710 in consecutive half cycles of the AC power waveform 702 and takes an average to yield the sampled amplitude 708. The initialization module 402 computes stored threshold amplitudes 720 as a predetermined percentage X of the absolute value of the sampled amplitude 708 and stores 916 the threshold amplitudes 720. The sampling module 302 and the initialization module 402 repeat steps 912, 914, and 916 until the sampling module 302 identifies 918 a zero crossing. In another embodiment, one of a plurality of storage areas may be used at each periodic calibration interval, thereby allowing the existing values for the stored threshold amplitude 720 to be obtained 806 from one storage area while the re-calibrated values are stored 916 in another storage area and the method 900 ends 920.

Figure 10:
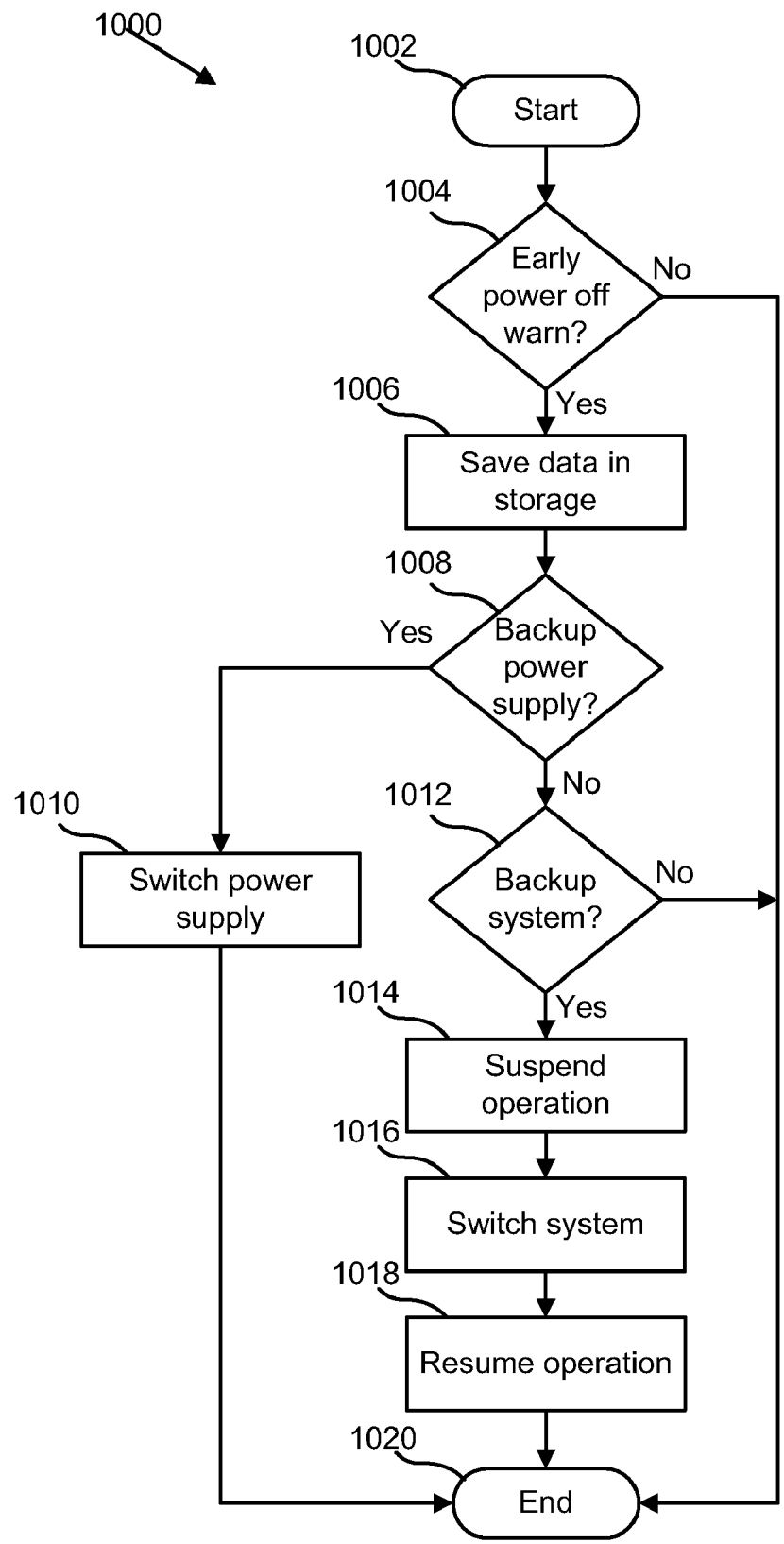
FIG. 10 is a schematic flow chart diagram illustrating one embodiment of a method for system recovery in accordance with the present invention.

FIG. 10 is a schematic flow chart diagram illustrating one embodiment of a method 1000 for system recovery in accordance with the present invention. The method 1000 starts 1002 and if the EPOW signal 310 is asserted 1004, then the primary computer 202-1 saves 1006 any desired volatile data in the storage subsystem 502. Otherwise, the method 1000 ends 1020. If the backup power supply 106-2 is available 1008, then it is switched 1010 in place of the primary power supply 106-1 to power the primary computer 202-1 and the method 1000 ends 1020. If neither the backup power supply 106-2 is available 1008 nor the backup computer 202-2 is available 1012, then the method 1000 ends 1020.

If the backup computer 202-2 is available, then operation of the primary computer 202-1 is gracefully suspended 1014, the processing context is switched 1016 to the backup computer 202-2, operation is resumed 1018 on the backup computer 202-2, and the method 1000 ends 1020. Note that the data that was saved 1006 by the primary computer 202-1 in the storage subsystem 502 is also accessible to the backup computer 202-2.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for determining power source failure, the apparatus comprising:

a power supply that receives an alternating current ("AC") power waveform, the power waveform comprising a predetermined frequency and a corresponding predetermined period;

a rectifier that rectifies the power waveform to yield a rectified power waveform;

an analog-to-digital converter that samples the rectified power waveform;

an initialization module that initializes a stored threshold amplitude, using the analog-to-digital converter, at a plurality of known points within the predetermined period by sampling the AC power waveform over a single half cycle of the predetermined period, the sampling at a sampling frequency which is a multiple of the predetermined frequency; and calibrates the stored threshold amplitude by multiplying each stored amplitude by a predetermined percentage of the stored amplitude, wherein the initialization module uses one single half cycle for sampling the AC power waveform, initializing the stored threshold amplitudes, and calibrating the stored threshold amplitudes without using other single half cycles of the AC power waveform;

a sampling module that samples, using the analog-to-digital converter, the AC power waveform, the sampling to obtain a sampled amplitude at times that correspond to the known points of the stored threshold amplitude;

a buffer module that buffers the sampled amplitude through a consecutive sequence of most recent sampled amplitudes;

a comparison module that compares the sampled amplitude to the stored threshold amplitude to obtain a comparison result, the stored threshold amplitude corresponding to the known point within the predetermined period;

an accumulation module that accumulates the most recent comparison results; and
a warning module that asserts an early power off warning signal if a predetermined number of the most recent comparison results each indicate that the sampled amplitude is smaller in absolute value than the stored threshold amplitude.

2. An apparatus for determining power source failure, the apparatus comprising:
an initialization module that
samples an alternating current ("AC") power waveform at a plurality of known points within a predetermined period of the AC power waveform, the power waveform comprising input to a power supply and comprising a predetermined frequency and the corresponding predetermined period, the samplings at a sampling frequency which is a multiple of the predetermined frequency, the samplings within a single half cycle of the AC power waveform;
initializes a plurality of stored threshold amplitudes by storing an amplitude of the AC power waveform for each of the known points; and
calibrates the stored threshold amplitude by multiplying each stored amplitude by a predetermined percentage of the stored amplitude,
wherein the initialization module uses one single half cycle for sampling the AC power waveform, initializing the stored threshold amplitudes, and calibrating the stored threshold amplitudes without using other single half cycles of the AC power waveform;
a sampling module that samples the AC power waveform to obtain a sampled amplitude corresponding to a known point within the predetermined period and within a period of the AC waveform subsequent to sampling by the initialization module;
a comparison module that compares the sampled amplitude to a stored threshold amplitude to obtain a comparison result, the stored threshold amplitude corresponding to the known point within the predetermined period;
an accumulation module that accumulates most recent comparison results; and
a warning module that asserts an early power off warning signal if a predetermined number of the most recent comparison results each indicate that the sampled amplitude is smaller in absolute value than the stored threshold amplitude,
wherein at least a portion of the initialization module, the sampling module, the comparison module, the accumulation module, and the warning module are one or more of logic hardware and executable code stored on computer readable non-transitory storage media, the executable code executable on a processor.

3. The apparatus of claim 2, further comprising a recovery module that, in response to the early power off warning signal, performs one or more of saving data of a computer and suspending operation of the computer, the computer powered by the power supply that receives the power waveform.

4. The apparatus of claim 2, wherein the sampling module comprises a rectifier that rectifies the power waveform such that the sampled amplitude is in absolute value.

5. The apparatus of claim 2, further comprising a buffer module that buffers the sampled amplitude through a consecutive sequence of most recent sampled amplitudes for comparison with the stored threshold amplitude.

6. The apparatus of claim 2, further comprising:
a power supply that receives the power waveform; and
a computer powered by the power supply.

7. The apparatus of claim 6, further comprising a storage subsystem in which data of the computer is saved in response to the early power off warning signal.

8. The apparatus of claim 6, further comprising a backup computer that is activated in response to the early power off warning signal.

9. The apparatus of claim 6, wherein the power supply comprises a primary power supply and further comprising a backup power supply, wherein the backup power supply provides power to a load powered by the primary power supply in response to the early power off warning signal.

10. The apparatus of claim 2, wherein the initialization module samples the AC power waveform at different times within the predetermined period, to record an amplitude at discrete points within a half cycle of the AC power waveform, than the sampling module and wherein the comparison module compares a sampled amplitude to an interpolated stored threshold amplitude, the interpolated stored threshold amplitude created by interpolating from two or more amplitudes corresponding to the discrete points, the interpolation using a curve fitting technique, the discrete points being near the known point within the predetermined period.

11. A non-transitory computer readable medium having computer usable program code executable to perform operations for determining power source failure, the operations of the computer program product comprising:
sampling an alternating current ("AC") power waveform at a plurality of known points within a predetermined period of the AC power waveform, the power waveform comprising input to a power supply and comprising a predetermined frequency and the corresponding predetermined period, the samplings at a sampling frequency which is a multiple of the predetermined frequency, the samplings within a single half cycle of the AC power waveform;
initializing a plurality of stored threshold amplitudes by storing an amplitude of the AC power waveform for each of the known points;
calibrating the stored threshold amplitude by multiplying each stored amplitude by a predetermined percentage of the stored amplitude, wherein the initializing and calibrating of the plurality of stored threshold points are for a single instance of a single half cycle of the AC power waveform;
sampling the AC power waveform to obtain a sampled amplitude corresponding to a known point within the predetermined period and within a period of the AC waveform subsequent to sampling by the initialization module;
comparing the sampled amplitude to the stored threshold amplitude to obtain a comparison result, the stored threshold amplitude corresponding to the known point within the predetermined period;
accumulating most recent comparison results in a first-in, first-out ("FIFO") buffer; and
asserting an early power off warning signal if all of the comparison results in the FIFO buffer each indicate that the sampled amplitude is smaller in absolute value than the stored threshold amplitude.

12. A machine-implemented method for determining power source failure, the method comprising:
sampling, using an initialization module, an alternating current ("AC") power waveform at a plurality of known points within a predetermined period of the AC power waveform, the power waveform comprising input to a power supply and comprising a predetermined frequency and the corresponding predetermined period, the samplings at a sampling frequency which is a multiple of the predetermined frequency, the samplings within a single half cycle of the AC power waveform;

initializing, using the initialization module, a plurality of stored threshold amplitudes by storing an amplitude of the AC power waveform for each of the known points;

calibrating, using the initialization module, the stored threshold amplitude by multiplying each stored amplitude by a predetermined percentage of the stored amplitude, wherein the initializing and calibrating of the plurality of stored threshold points are for a single instance of a single half cycle of the AC power waveform;

sampling, using a sampling module, the AC power waveform to obtain a sampled amplitude corresponding to a known point within the predetermined period and within a period of the AC waveform subsequent to sampling by the initialization module;

comparing, using a comparison module, the sampled amplitude to a stored threshold amplitude to obtain a comparison result, the stored threshold amplitude corresponding to the known point within the predetermined period;

accumulating, using an accumulation module, most recent comparison results; and asserting, using a warning module, an early power off warning signal if a predetermined number of the most recent comparison results each indicate that the sampled amplitude is smaller in absolute value than the stored threshold amplitude, wherein at least a portion of the initialization module, the sampling module, the comparison module, the accumulation module, and the warning module are one or more of logic hardware and executable code stored on computer readable non-transitory storage media, the executable code executable on a processor.

13. The method of claim 12, further comprising buffering the sampled amplitude through a consecutive sequence of most recent sampled amplitudes prior to comparing the sampled amplitude to a stored threshold amplitude.

14. The method of claim 12, wherein calibrating the stored threshold amplitude is performed at periodic intervals, wherein the stored threshold amplitude is stored in one of a plurality of storage areas for each successive interval.

15. The method of claim 12, further comprising saving data of a computer powered by a power supply that receives the power waveform in response to the early power off warning signal.

16. The method of claim 15, further comprising suspending operation of the computer in response to the early power off warning signal.

17. The method of claim 16, further comprising activating a backup computer in response to the early power off warning signal.

18. The method of claim 12, further comprising providing power to a load with a backup power supply in response to the early power off warning signal, the load connected to the power supply receiving the AC power waveform.

* * * * *